(12) United States Patent
Kim (10) Patent No.: US 7,232,698 B2
(45) Date of Patent: Jun. 19, 2007

(54) METHOD FOR FABRICATING CMOS IMAGE SENSOR PROTECTING LOW TEMPERATURE OXIDE DELAMINATION

(75) Inventor: Eun-Ji Kim, Chungcheongbuk-do (KR)

(73) Assignee: MagnaChip Semiconductor, Ltd., Chungcheongbuk-do (KR)

( * ) Notice: Subject to any disclaimer, the term of this patent is extended or adjusted under 35 U.S.C. 154(b) by 224 days.

(21) Appl. No.: 10/971,183

(22) Filed: Oct. 22, 2004

(65) Prior Publication Data

US 2005/0090035 A1    Apr. 28, 2005

(30) Foreign Application Priority Data

Oct. 24, 2003   (KR)  ............ 10-2003-0074572

(51) Int. Cl.
*H01L 21/00*   (2006.01)
(52) U.S. Cl. ............... 438/48; 438/58; 438/65; 438/70; 257/E31.121
(58) Field of Classification Search ........ 438/48, 438/58, 59, 65, 70
See application file for complete search history.

(56) References Cited

U.S. PATENT DOCUMENTS 6,617,189 B1 *  9/2003  Chen et al. ............. 438/48
6,670,205 B1 * 12/2003  Byun ................... 438/22

* cited by examiner

*Primary Examiner*—Fernando L. Toledo
(74) *Attorney, Agent, or Firm*—Marshall, Gerstein & Borun LLP

(57) ABSTRACT

A method for fabricating a complementary metal oxide semiconductor image sensor is capable of protecting a low temperature oxide from delaminating a passivation layer. The method includes the steps of: forming a passivation layer on a pad metal; exposing a predetermined part of the pad metal by patterning the passivation layer using a first pad mask; forming an oxide layer on the exposed pad metal and the passivation layer formed around the pad open region; forming a color filter, a planarization layer and a microlens, sequentially; forming a low temperature oxide layer on the above structure to protect the microlens; and opening the pad metal by selectively etching the low temperature oxide layer and the oxide layer formed around the pad open region by a second pad mask.

8 Claims, 7 Drawing Sheets

FORMING    LTO   PATTERNED PASSIVATION LAYER
PASSIVATION HOLE

FIG. 4B

FORMING    LTO   PATTERNED PASSIVATION
PASSIVATION STRING

METHOD FOR FABRICATING CMOS IMAGE SENSOR PROTECTING LOW TEMPERATURE OXIDE DELAMINATION

FIELD OF THE INVENTION

The present invention relates to a method for fabricating a complementary metal oxide semiconductor (CMOS) image sensor; and more particularly, to a method for fabricating a CMOS image sensor capable of protecting a low temperature oxide layer from a delamination phenomenon at a pad peripheral region by performing a pad etching process twice and changing a pad layout.

DESCRIPTION OF RELATED ARTS

In general, an image sensor is a semiconductor device that converts an optical image into electrical signals. In a charge coupled device (CCD) is the semiconductor device that each of metal-oxide-silicon (MOS) capacitors are placed in close proximity and charge carriers are stored in or transferred between capacitors. CMOS image sensors are devices adopting a switching method for detecting output sequentially by making and using as many MOS transistors as the number of pixels based on CMOS technology that uses peripheral circuits such as control circuits and signal processing circuits.

As is well known, an image sensor for color images has a color filter array (CFA) on top of a photo sensing unit, which generates and stores photo-generated charges in response to external lights. The color filter array (CFA) has 3 colors of Red, Green and Blue, or 3 colors of Yellow, Magenta and Cyan.

Also, the image sensor includes a photo sensing part that detects light, and a logic circuit that converts the light into electrical signals and data. In order to increase photosensitivity, there are ongoing efforts to increase the fill factor, i.e., the ratio of area of the photo sensing part to the total area of an image sensor device. However, since the logic circuit part is indispensable, there is a limit to what these efforts can achieve. Therefore, for the purpose of increasing photosensitivity, a condenser lens technique was proposed, which controls the paths of the lights incident upon nearby areas outside the photo sensing part. An image sensor using this technique has a microlens formed on the CFA.

Figure 1A:
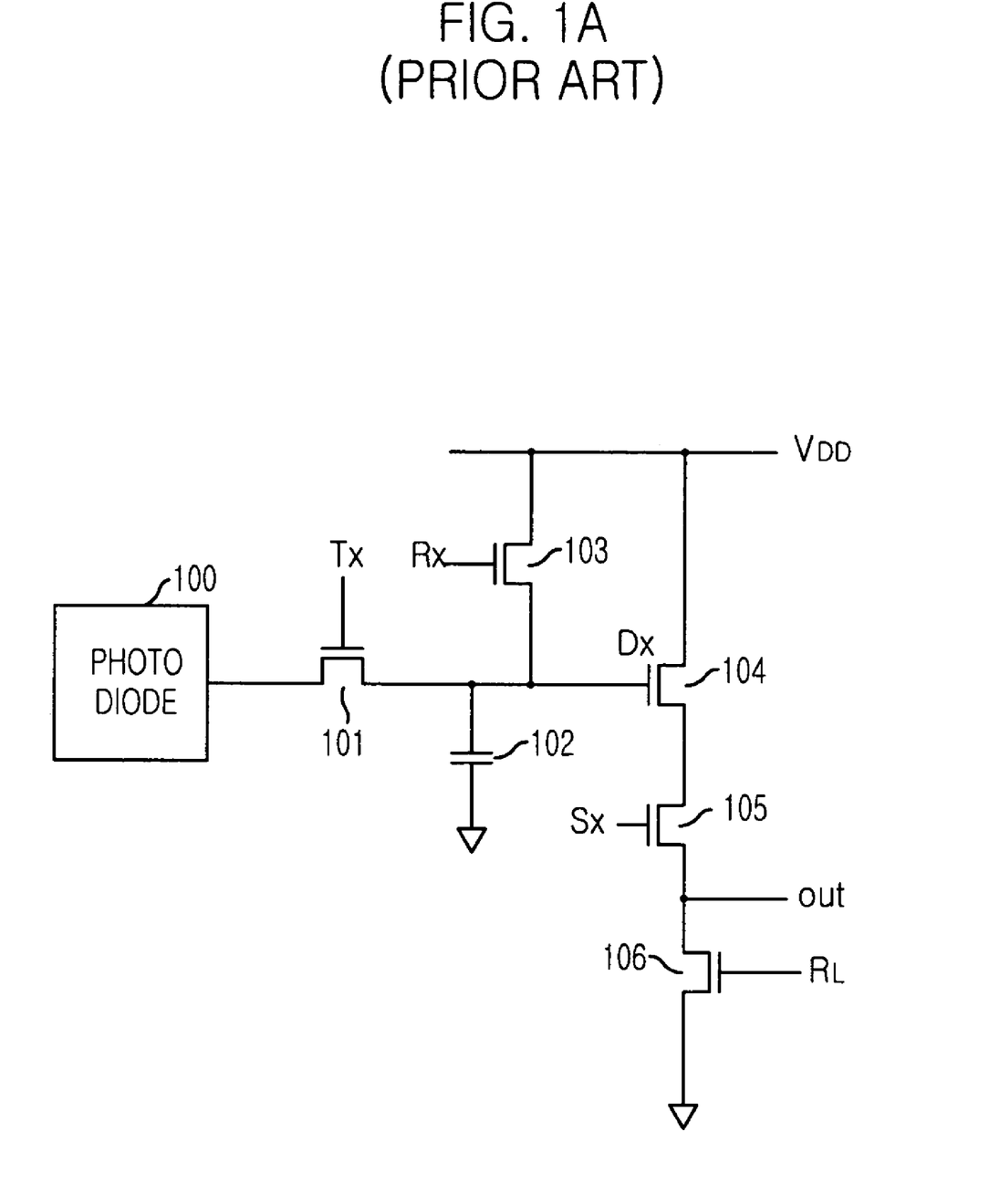
FIG. 1A is a circuit diagram showing a unit pixel of a conventional complementary metal oxide semiconductor (CMOS) image sensor.

FIG. 1A is a circuit diagram showing a conventional CMOS image sensor whose unit pixel consists of four MOS transistors and one photodiode. The CMOS image sensor is provided with a photodiode 100 for receiving light and for generating photo-generated charges, a transfer transistor 101 for transferring the photo-generated charges collected by the photodiode 100 to the floating diffusion region 102, a reset transistor 103 for setting the potential of the floating diffusion region to a desired value and for resetting the floating diffusion region 102 by outputting charges, a drive transistor 104 for operating as a source follower buffer amplifier, and a select transistor for 105 for providing addressing by switching. Outside the unit pixel, there is a load transistor 106 for reading output signals.

Figure 1B:
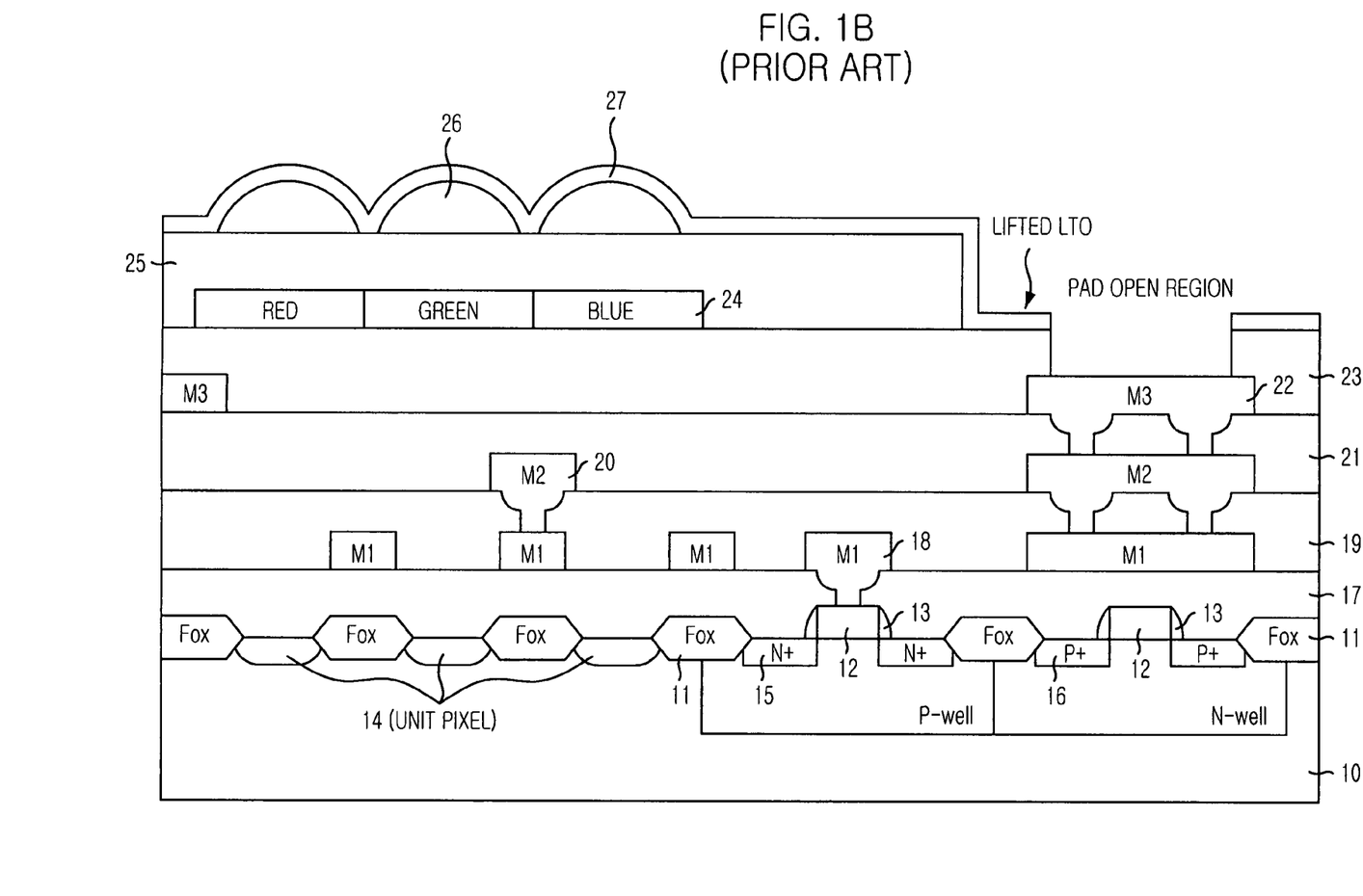
FIG. 1B is a cross-sectional view of a conventional CMOS image sensor.

FIG. 1B is a cross-sectional view showing a cross-sectional structure of a CMOS image sensor comprising of a unit pixel, a color filter and a microlens.

Referring to FIG. 1B, the conventional CMOS image sensor includes a plurality of device isolation layers 11 formed on a substrate 10, a plurality of gate electrodes 12 having a plurality of spacers 13 formed on the substrate and a p type well and an n type well formed in a certain region inside of the substrate, a plurality of unit pixels 14 including a photodiode, a plurality of n type ion implanting regions 15, a plurality of p type ion implanting regions 16, an inter-layer insulation layer 17 formed on the substrate including the plurality of gate electrodes, a plurality of first metal interconnection lines 18, a first metal inter-layer insulation layer 19 covering the plurality of first metal interconnection lines 18, a plurality of second metal interconnection lines 20 formed on the first metal inter-layer insulation layer 19, a second metal inter-layer insulation layer 21 covering the plurality of second metal interconnection lines 20, a plurality of third metal interconnection lines 22 formed on the second metal inter-layer insulation layer 21, a passivation layer 23 covering the plurality of third metal interconnection lines 22 and protecting the device, a plurality of color filters 24 formed in the unit pixel region on the passivation layer 23, an overcoating layer 25 for compensating for a height difference caused by the color filters 24, a plurality of microlenses 26 formed on the overcoating layer 25 and a low temperature oxide (LTO) layer 27 for protecting the microlenses.

Meanwhile, the LTO layer 27 is mainly formed on the plurality of microlenses 26 and the overcoating layer 25 in a light receiving region formed with the unit pixels. However, the LTO layer 27 is formed directly on the passivation layer 23 in a pad open region.

Figure 1C:
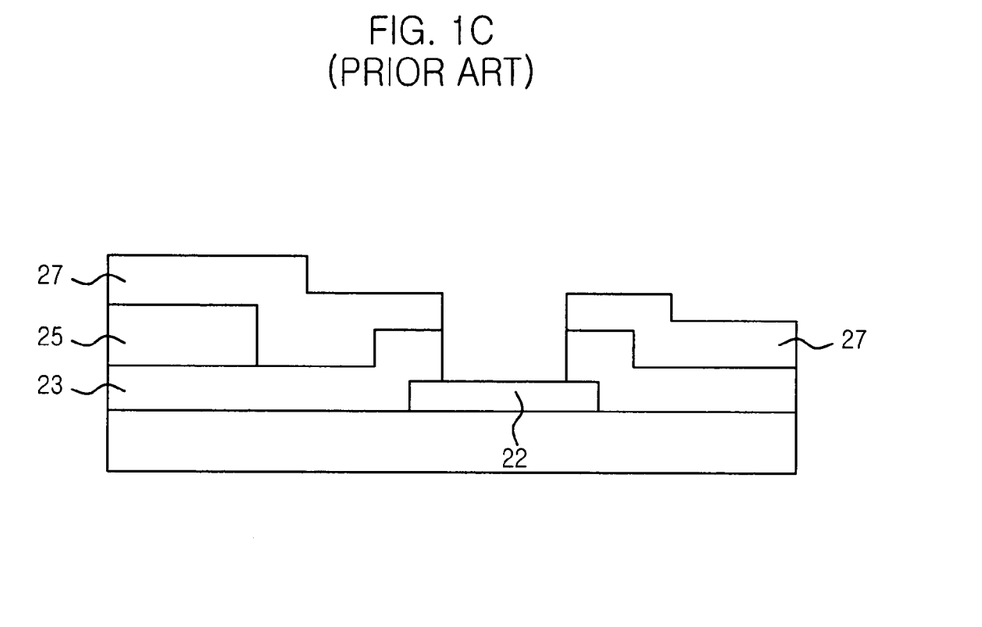
FIG. 1C is a cross-sectional view illustrating a reason why a low temperature oxide layer is delaminated in a pad peripheral region illustrated in FIG. 1B.

FIG. 1C is a diagram enlarging a pad peripheral region of a structure illustrated in FIG. 1B. A phenomenon that the LTO layer 27 is delaminated is often happened while performing subsequent processes because the passivation layer 23, the overcoating layer 25 and the LTO layer 27 are unstably attached each other at the pad peripheral region.

Referring to FIG. 1C, the passivation layer 23 and the LTO layer 27 are etched in a straight line in the pad open region, thereby having a structure through which impurities can easily penetrate.

That is, as for the conventional CMOS image sensor, during a PR stripping process for removing a pad photoresist (not shown in FIG. 1) used for opening the pad, the impurities penetrate through between the passivation layer 23 and the LTO 27 layer; and thus, the pad peripheral region is slightly lifted. If a wafer back grinding process or a sawing process is performed in the pad peripheral region, a LTO crack that the LTO layer is even removed by a physical force exerted during the wafer back grinding process or the sawing process is happened.

If the LTO crack penetrates through the pixel, a serious defect is generated to an image, thereby drastically degrading a yield of probe.

SUMMARY OF THE INVENTION

It is, therefore, an object of the present invention to provide a method for fabricating a complementary metal oxide semiconductor (CMOS) image sensor capable of protecting a low temperature oxide (LTO) layer from a delamination phenomenon.

The present invention provides a method for fabricating a CMOS image sensor capable of preventing a LTO layer from a delamination phenomenon by performing a pad etching process twice and changing a pad layout.

In accordance with one aspect of the present invention, there is provided a method for fabricating a CMOS image sensor protecting a low temperature oxide delamination, including the steps of: forming a passivation layer on a pad metal; exposing a predetermined part of the pad metal by patterning the passivation layer using a first pad mask;

forming an oxide layer on the exposed pad metal and the passivation layer formed around the pad open region; forming a color filter, a planarization layer and a microlens, sequentially; forming a low temperature oxide layer on the above structure to protect the microlens; and opening the pad metal by selectively etching the low temperature oxide layer and the oxide layer formed around the pad open region by a second pad mask.

In accordance with another aspect of the present invention, there is provided a method for fabricating a CMOS image sensor provided with a pad open region, including the steps of: forming a passivation layer on a pad metal; depositing an oxide layer on the passivation layer; exposing a predetermined part of the pad metal by patterning the passivation layer and the oxide layer using a first pad mask; forming a color filter, a planarization layer and a microlens, sequentially; depositing a low temperature oxide layer on the above structure to protect the microlens; and opening the pad metal by selectively etching the low temperature oxide layer and the oxide layer formed around the pad open region by a second pad mask.

BRIEF DESCRIPTION OF THE DRAWINGS

The above and other objects and features of the present invention will become better understood with respect to the following description of the preferred embodiments given in conjunction with the accompanying drawings, in which:

FIGS. 2A to 2E are cross-sectional views illustrating fabricating processes of a CMOS image sensor in accordance with a preferred embodiment of the present invention;

DETAILED DESCRIPTION OF THE INVENTION

Hereinafter, detailed descriptions on preferred embodiments of the present invention will be provided with reference to the accompanying drawings.

FIGS. 2A to 2E are cross-sectional views illustrating fabricating processes of a complementary metal oxide semiconductor (CMOS) image sensor in accordance with a preferred embodiment of the present invention. Herein, an explanation about processes performed until a passivation layer 32 is formed is omitted since it is identical to that of a conventional method.

Figure 2A:
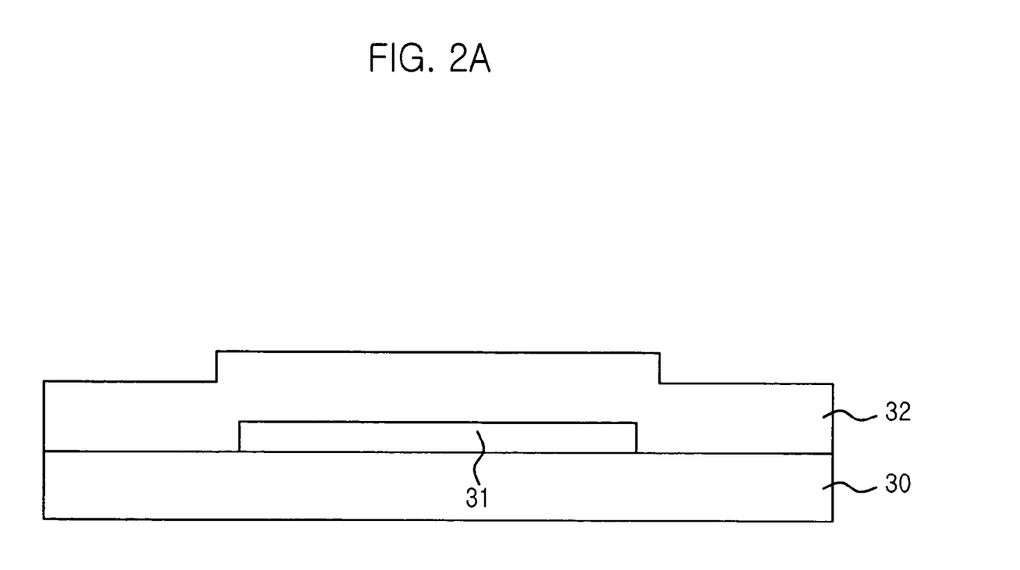

Referring to FIG. 2A, a pad metal 31 is formed on a metal inter-layer insulation layer 30 and the pad metal 31 is covered with a passivation layer 32.

Figure 2B:
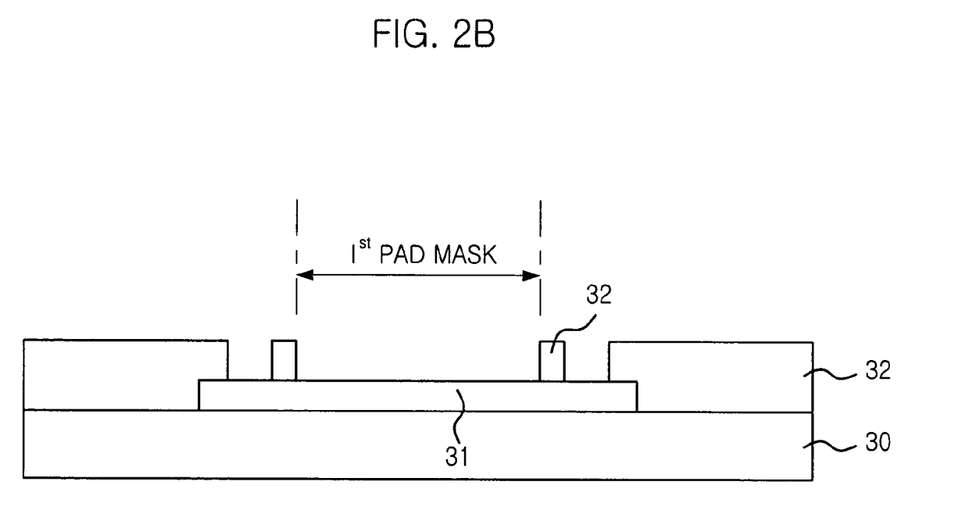

FIG. 2B is a cross-sectional view illustrating the pad metal 31 exposed by selectively etching the passivation layer 32 with use of a pad mask.

Referring to FIG. 2B, a first pad etching process is performed by using a first pad mask after forming the passivation layer 32 shown in FIG. 2A.

According to a conventional CMOS image sensor, the pad etching process is employed only once. However, the pad etching process is employed twice in accordance with the present invention. Hereinafter, a mask used for the first pad etching process is referred as a first pad mask and a mask used for a second etching process is referred as a second pad mask.

As explained later, the first pad mask exposes the pad metal 31 more widely than the second pad mask does. In accordance with the present invention, two types of the masks are used for the first pad mask. For instance, the first and the second mask are distinguished from each other according to a hole shape or a string shape of a plane of each mask.

Figure 2C:
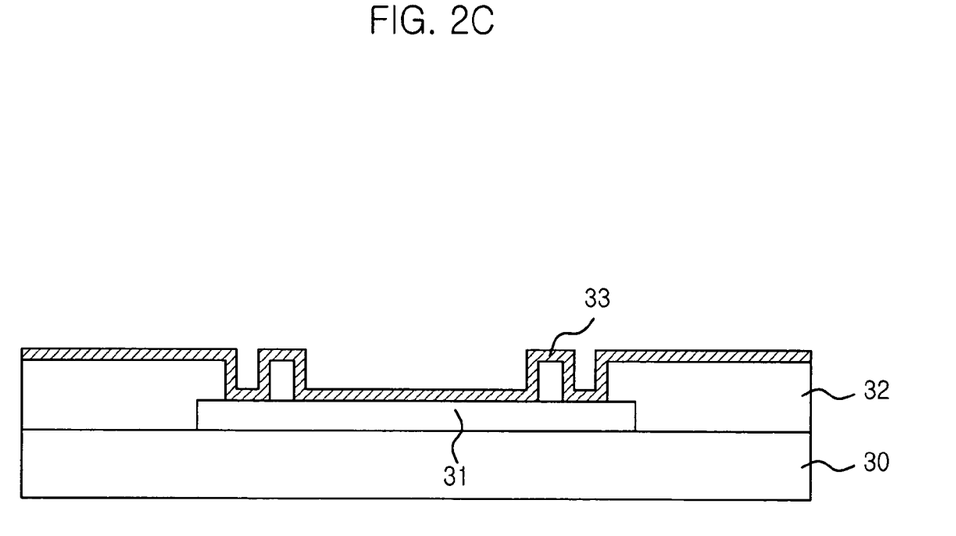

Likewise, referring to FIG. 2C, an oxide layer 33 is deposited along the pad open region after performing the first pad etching process. Herein, the oxide layer 33 plays a role of increasing adhesive force between a low temperature oxide (LTO) layer which will be deposited later and the passivation layer 32. It is preferable that the oxide layer 33 is not formed in a region where a color filter and a microlens will be formed but is selectively formed only along the pad open region.

In accordance with the preferred embodiment of the present invention, the oxide layer 33 is deposited after the first pad etching process. However, it is allowed to reverse the order. Specifically, the first pad etching process can be performed after depositing the oxide layer 33 on the passivation layer 32.

Figure 2D:
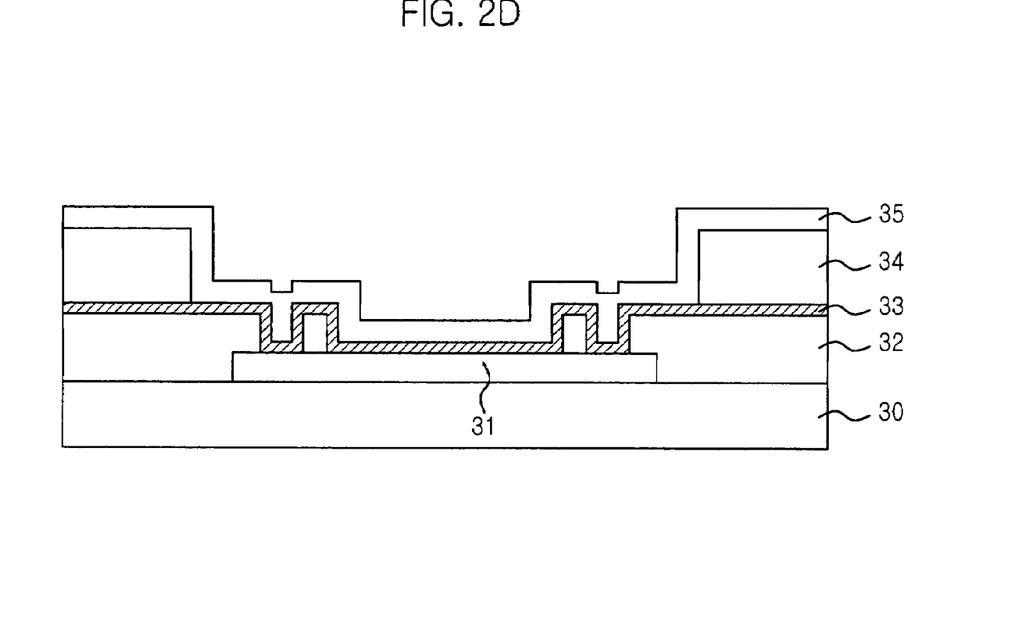

Referring to FIG. 2D, a process for forming a color filter (not shown) proceeds and then, an overcoating layer 34 is deposited on the color filter for the purpose of planarization. Subsequently, the microlens (not shown) is formed on the overcoating layer 34 and then, the low temperature oxide (LTO) layer 35 is deposited on the overcoating layer 34 and the oxide layer 33 through a subsequent process.

The cross-sectional view of the CMOS image sensor formed through the processes described above is illustrated in FIG. 2D. Referring to FIG. 2D, the pad metal 31 has not opened yet since the LTO layer 35 is deposited on the pad metal 31.

Accordingly, a second pad etching process for actually opening the pad is performed through a subsequent process. The second pad etching process will be explained with reference to FIG. 2E.

Figure 2E:
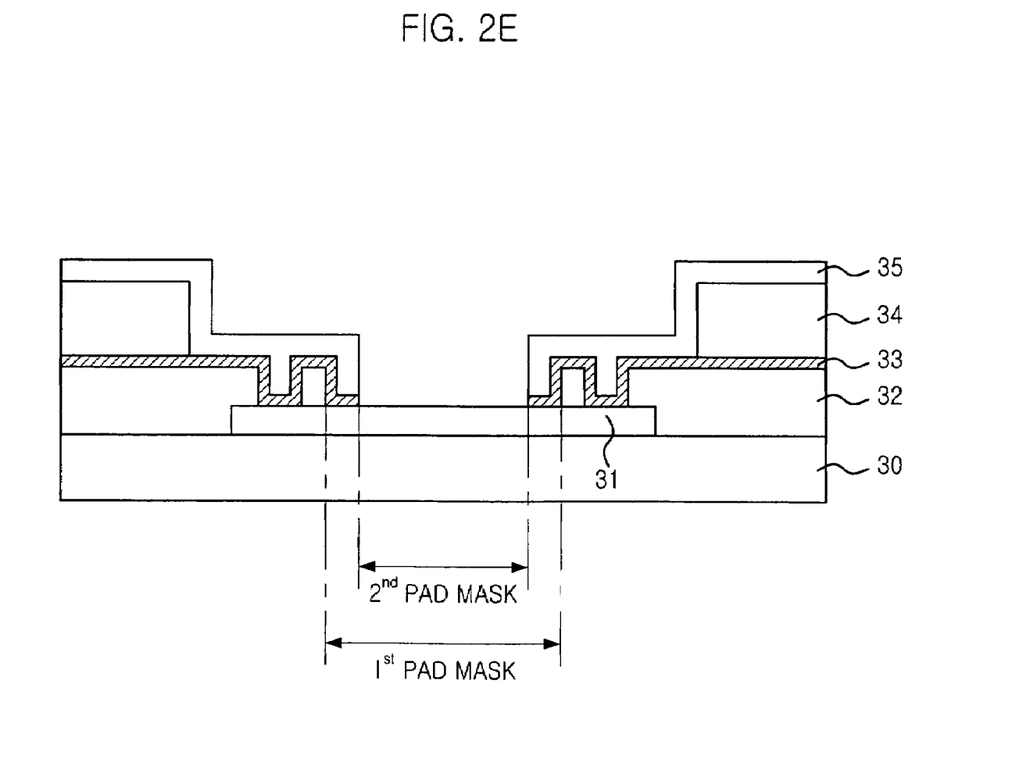

The mask used for the second pad etching process is called the second pad mask as mentioned above. Referring to FIG. 2E, the second pad mask exposes a smaller area of the pad metal 31 compared with the first pad mask.

Referring to FIG. 2E, the LTO layer 35 and the oxide layer 33 are only layers of which the profiles are exposed through the second pad etching process. Since the passivation layer 32 is not exposed, it is possible to prevent impurities from penetrating through, thereby preventing the delamination phenomenon generated during fabricating the conventional CMOS image sensor.

Furthermore, referring to FIG. 2E, the passivation layer 32 and the LTO layer 35 are contacted with each other, wherein each of the passivation layer 32 and the LTO layer 35 is provided with a portion in the form of a concavo-convex. Thus, since an area where the contact area between the passivation layer 32 and the LTO layer 35 is larger than that of the conventional method, it is possible to prevent the delamination phenomenon of the LTO layer 35 in accordance with the preferred embodiment of the present invention.

In addition, the oxide layer 33 for improving an adhesive force between the LTO layer 35 and the passivation layer 32 is existed in the present invention. The passivation layer 32 itself is subjected to patterning to make a hole shape or a string shape as encircling the pad metal 31. Therefore, not only the area where the passivation layer 32 and the LTO layer 35 are contacted each other gets larger but also a hole or a string pierced into the passivation layer 32 can play a role of stopping the delamination of the LTO layer 35.

Figure 3A:
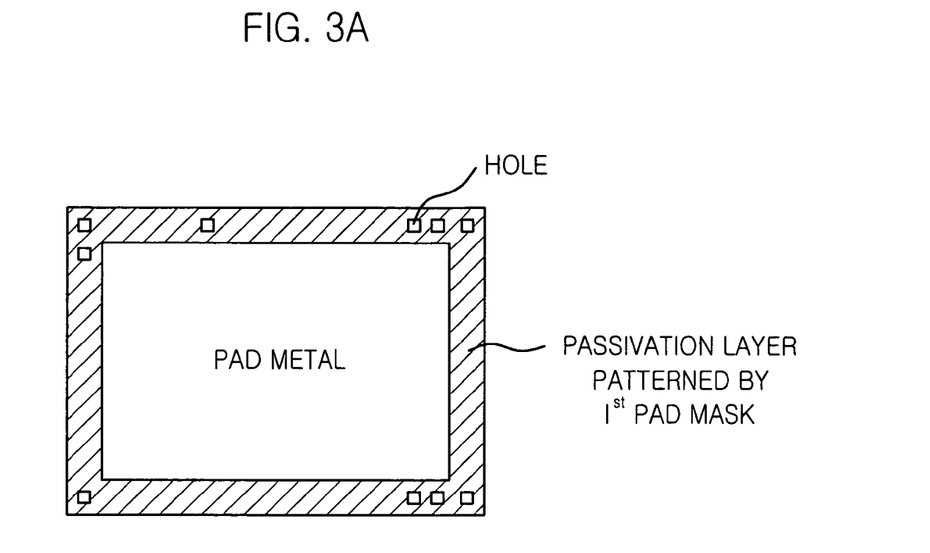
FIG. 3A is a top view illustrating a pad and a passivation layer patterned by performing a first pad etching process with use of a first pad mask.
Figure 3B:
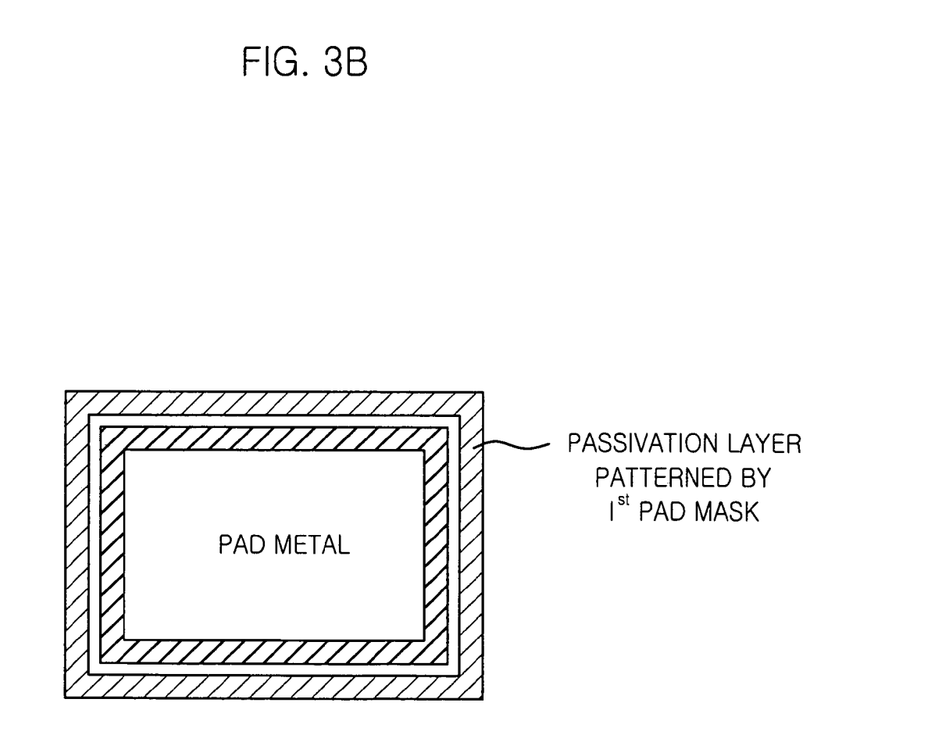
FIG. 3B is a top view illustrating a pad and a passivation layer patterned by performing a second pad etching process with use of a second pad mask.

A top view illustrating the cross-sectional view of the patterned pad metal is shown in FIG. 3A or FIG. 3B. Referring to FIG. 3A, the passivation layer patterned by using the hole shaped first mask is illustrated. The first mask, as mentioned above, is one of the first pad masks used in the present invention. If using the hole shaped first mask, the pad metal can be exposed by selectively etching the passivation layer as forming the holes around the pad metal.

Referring to FIG. 3B, the passivation layer patterned by the string shaped second mask is illustrated. The second mask, as mentioned above, is one of the first pad masks used in the present invention. If using the string shaped second mask, the pad metal can be exposed by selectively etching the passivation layer as forming the string shape around the pad metal.

Figure 4A:
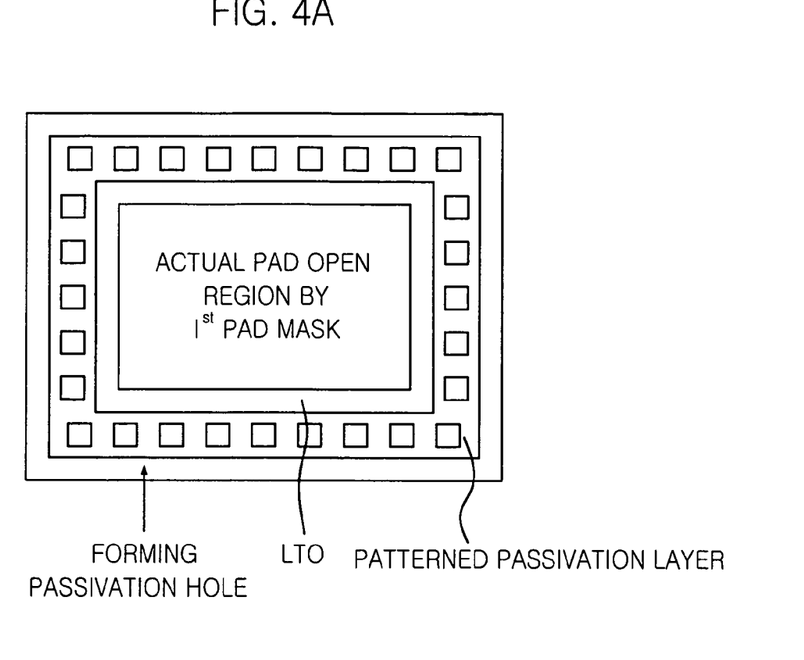
FIGS. 4A to 4B are top views illustrating a final shape of which a pad has opened in accordance with a preferred embodiment of the present invention.
Figure 4B:
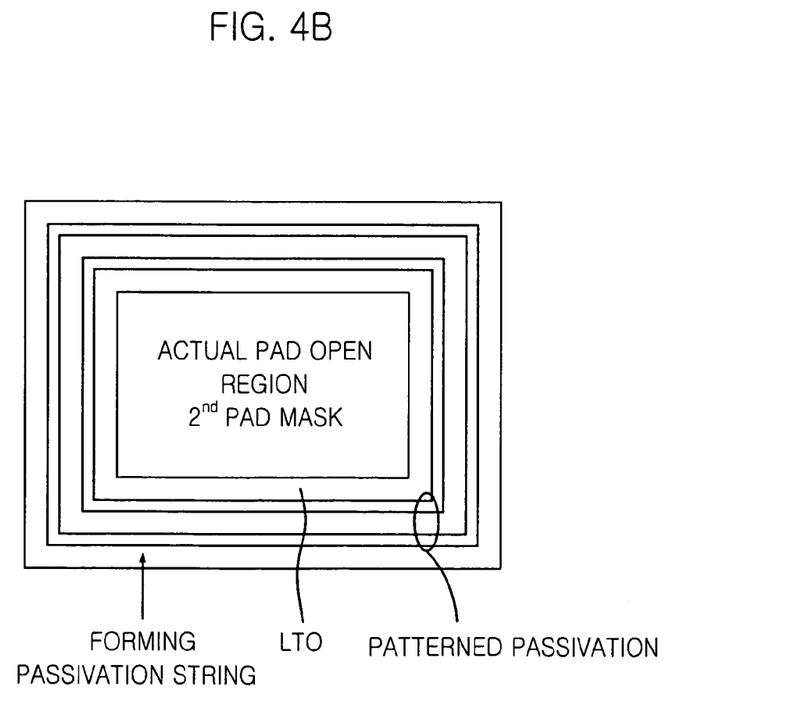

Next, FIGS. 4A and 4B are explained. FIGS. 4A and 4B are top views illustrating a completed state of a second pad etching process shown in FIG. 2E. However, FIGS. 4A and 4B do not describe a state shown in FIG. 2E exactly and are top views illustrating even the passivation layer 32 existed under the LTO layer 32 for the sake of convenience.

Specifically, for exactly describing the state shown in FIG. 2E with the top views of FIGS. 4A and 4B, only the LTO layer 35 on a top portion and the exposed pad metal 31 should be illustrated. However, for the sake of convenience, the passivation layer 32 existed under the LTO layer 35 is also illustrated With a reference to the aforementioned facts, the pad metal exposed by the second pad etching process and the passivation layer patterned to have the holes as encircling the exposed pad metal are illustrated in FIG. 4A. Also, the LTO layer is illustrated between the exposed pad metal and the passivation layer.

Similarly, the passivation layer patterned to have a string shape is illustrated in FIG. 4B and the remaining elements are the same as illustrated in FIG. 4A.

If a pad etching process performed twice, introduction of an oxide layer for improving an adhesive force between the passivation layer and the low temperature oxide layer, and a patterning process performed to the passivation layer to form a hole shape or a string shape are applied to a method for fabricating a CMOS image sensor, it is possible to apparently improve yields of producing a products by preventing a delamination of the low temperature oxide layer.

The present application contains subject matter related to the Korean patent application No. KR 2003-0074572, filed in the Korean Patent Office on Oct. 24, 2003, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating an image sensor, comprising the steps of:

forming a passivation layer on a pad metal;

exposing a predetermined part of the pad metal by patterning the passivation layer using a first pad mask;

forming an oxide layer on the exposed pad metal and the passivation layer formed around the pad open region;

sequentially forming a color filter, a planarization layer and a microlens, and forming a low temperature oxide layer on the resulting structure to protect the microlens; and partially etching the low temperature oxide layer and the oxide layer over the pad metal to expose a select part of the pad without exposing the patterned passivation layer.

2. The method of claim 1, wherein the step of exposing the passivation layer by the first pad mask is performed so as to form holes encircling the exposed part of the pad metal.

3. The method of claim 1, wherein the step of exposing the passivation layer by the first pad mask is performed so as to form a string encircling the exposed part of the pad metal.

4. The method of claim 1, wherein an area of the second pad mask is smaller than that of the first pad mask.

5. A method for fabricating an image sensor, comprising the steps of:

forming a passivation layer over a pad metal;

depositing an oxide layer on the passivation layer;

exposing a predetermined part of the pad metal by patterning the passivation layer and the oxide layer using a first pad mask;

sequentially forming a color filter, a planarization layer, and a microlens and depositing a low temperature oxide layer on the above structure to protect the microlens; and partially etching the low temperature oxide layer over the pad metal to expose a select part of the pad metal without exposing the patterned passivation layer.

6. The method of claim 5, wherein the step of exposing the passivation layer by the first pad mask is performed to form holes encircling the exposed pad metal.

7. The method of claim 5, wherein the step of exposing the passivation layer by the first pad mask is performed to form a string encircling the exposed pad metal.

8. The method of claim 5, wherein an area of the pad metal exposed by the second pad mask is smaller than that exposed by the first pad mask.

* * * * *